United States Patent
Fujita et al.

(10) Patent No.: US 9,049,394 B2
(45) Date of Patent: Jun. 2, 2015

(54) SOLID IMAGING DEVICE

(75) Inventors: Kazuki Fujita, Hamamatsu (JP); Ryuji Kyushima, Hamamatsu (JP); Harumichi Mori, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 145 days.

(21) Appl. No.: 13/979,556

(22) PCT Filed: Dec. 20, 2011

(86) PCT No.: PCT/JP2011/079537
§ 371 (c)(1),
(2), (4) Date: Jul. 12, 2013

(87) PCT Pub. No.: WO2012/098801
PCT Pub. Date: Jul. 26, 2012

(65) Prior Publication Data
US 2013/0292549 A1 Nov. 7, 2013

(30) Foreign Application Priority Data
Jan. 17, 2011 (JP) ................................ 2011-007019

(51) Int. Cl.
| | | |
|---|---|---|
| H01L 27/00 | (2006.01) | |
| H04N 5/3745 | (2011.01) | |
| H01L 27/146 | (2006.01) | |
| H04N 5/374 | (2011.01) | |
| H04N 5/357 | (2011.01) | |
| H04N 5/378 | (2011.01) | |
| H04N 5/353 | (2011.01) | |

(52) U.S. Cl.
CPC ........ *H04N 5/3745* (2013.01); *H01L 27/14658* (2013.01); *H04N 5/374* (2013.01); *H04N 5/357* (2013.01); *H04N 5/378* (2013.01); *H01L 27/14603* (2013.01); *H04N 5/3532* (2013.01)

(58) Field of Classification Search
CPC ................... H01L 27/14609; H01L 27/14612; H04N 5/378; H04N 5/3745
USPC .............. 250/208.1, 214 R, 214 LS, 214 SW; 348/302–305, 308, 322, E5.091
See application file for complete search history.

(56) References Cited

U.S. PATENT DOCUMENTS

2013/0299679 A1* 11/2013 Kyushima et al. ......... 250/208.1

FOREIGN PATENT DOCUMENTS

| JP | 2000-046645 A | 2/2000 |
|---|---|---|
| JP | 2003-296722 A | 10/2003 |
| JP | 2007-057535 A | 3/2007 |
| JP | 2007-312361 A | 11/2007 |
| JP | 2009-065272 A | 3/2009 |

* cited by examiner

*Primary Examiner* — Kevin Pyo
(74) *Attorney, Agent, or Firm* — Drinker Biddle & Reath LLP

(57) ABSTRACT

A solid-state imaging device includes a photodetecting section including pixels each including a transistor and a photodiode, readout wiring lines connected to the transistors, a signal output section for sequentially outputting voltage values according to the amounts of charges input through the respective readout wiring lines, potential change switches for switching the potentials of the readout wiring lines to a potential Vdr different from input potentials of integration circuits of the signal output section, and a controlling section. The controlling section switches potentials of the readout wiring lines to the different potential Vdr for a predetermined period included in a period, after an elapse of a readout period where voltage values corresponding to the amounts of charges generated in the pixels are sequentially output from the signal output section, until a next readout period is started.

5 Claims, 12 Drawing Sheets

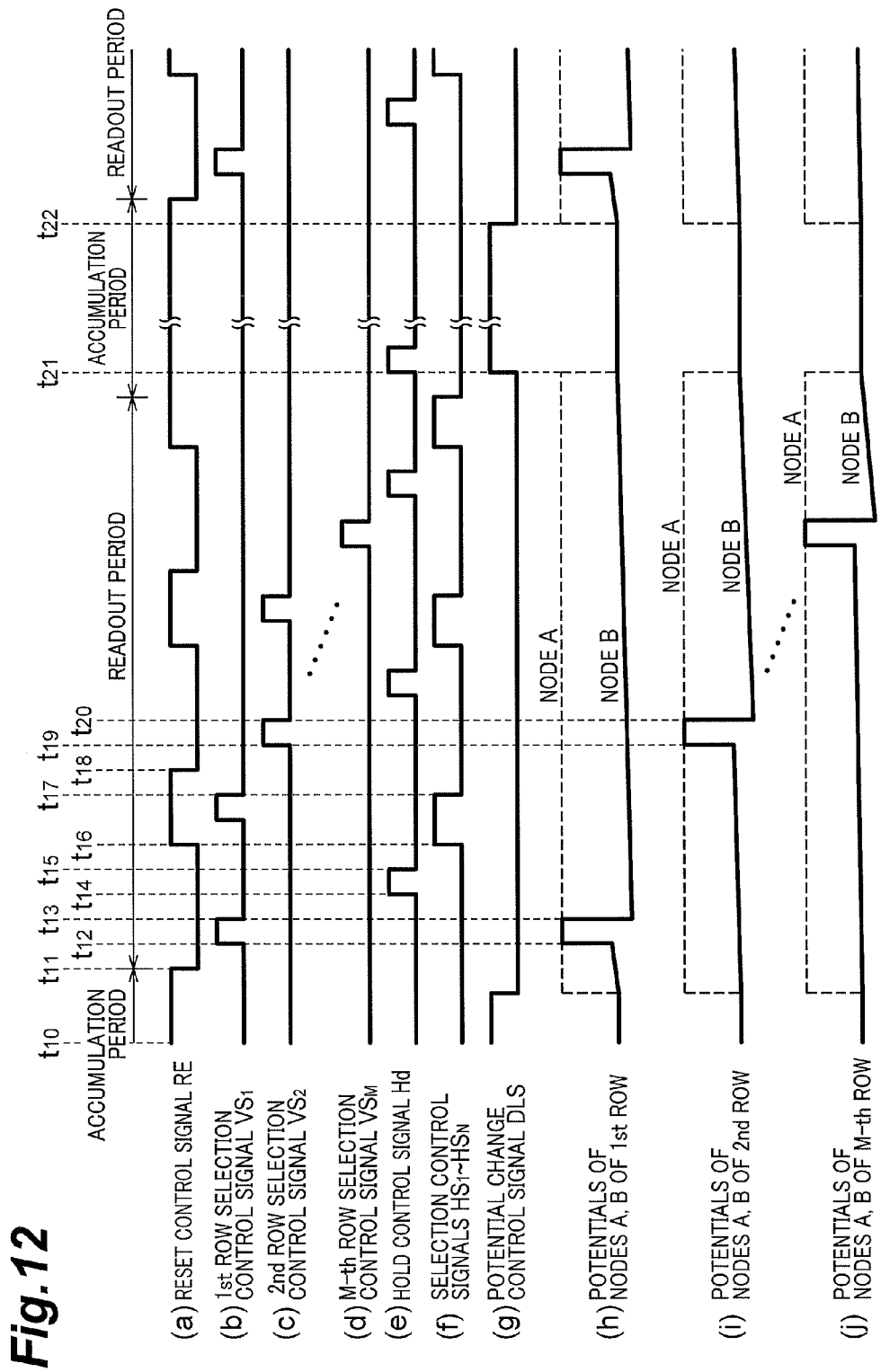

SOLID IMAGING DEVICE

TECHNICAL FIELD

The present invention relates to a solid-state imaging device.

BACKGROUND ART

Patent Document 1 describes a photoelectric conversion device. This photoelectric conversion device includes a photoelectric converting circuit section for which a plurality of photoelectric converting elements are disposed in a matrix form and a plurality of signal wiring lines for transferring signals output from the photoelectric converting circuit section to a reading circuit. Each of the plurality of signal wiring lines is connected with each one end of a plurality of reset switches, and the other-side ends of the reset switches are grounded. In this photoelectric conversion device, charge resetting of the photoelectric converting elements is performed via the plurality of signal wiring lines by bringing the reset switches into a connected state.

CITATION LIST

Patent Literature

Patent Document 1: Japanese Patent Application Laid-Open No. 2000-46645
Patent Document 2: Japanese Patent Application Laid-Open No. 2009-65272

SUMMARY OF INVENTION

Technical Problem

A solid-state imaging element includes a photodetecting section in which a plurality of pixels are disposed two-dimensionally over a plurality of rows and a plurality of columns. In the respective pixels, photodiodes for converting incident light into electrons are disposed. The photodiode of each of the pixels is connected to a readout wiring line arranged for each column via a switch, and a charge accumulated in the photodiode flows out to the readout wiring line as a result of bringing the switch into a connected state. Generally, such a switch is constructed by a transistor.

However, between the control terminal (base or gate) and current terminals (collector and emitter or source and drain) of a transistor, a parasitic capacitance exists. Therefore, when the switch is brought into a connected state (that is, a predetermined voltage is applied to the control terminal of the transistor), a charge is accumulated in the parasitic capacitance between the control terminal and current terminals. Then, when the switch is brought into a non-connected state (that is, the application of a voltage to the control terminal of the transistor is stopped) after the charge is taken out of the photodiode, the charge accumulated in the parasitic capacitance moves to the photodiode. Accordingly, a potential difference (offset) occurs between the photodiode electrode and the readout wiring line.

Subsequently, in the photodetecting section, the switches are kept in a non-connected state over a certain predetermined period to convert incident light into electrons and accumulate the charge in the photodiodes (hereinafter, referred to as an accumulation period), and in that period, the above-mentioned offset varies temporally due to various causes. For example, the current terminals of the transistor are not completely insulated therebetween to cause a minute leak, so that the above-mentioned offset temporally changes due to this leak. If the offset thus varies temporally, the amount of charge to be output from the photodiode varies depending on whether the setting value of the accumulation period is for a long or short period, which becomes a factor for degradation in detection accuracy of incident light in the respective pixels.

The present invention has been made in view of the above problem, and an object thereof is to provide a solid-state imaging device capable of enhancing the detection accuracy of incident light in the respective pixels.

Solution to Problem

In order to solve the above-described problem, a solid-state imaging device according to the present invention includes a photodetecting section having M×N (M is an integer not less than 2, N is an integer not less than 2) pixels each including a photodiode and a transistor connected at one end to the photodiode that are arrayed two-dimensionally in M rows and N columns, N readout wiring lines arranged for each column, and connected to the-other-side ends of the transistors included in the pixels of corresponding columns, a signal output section including N integration circuits for generating voltage values according to amounts of charges input through the respective N readout wiring lines, and for sequentially outputting voltage values output from the N integration circuits, a potential changing means for switching potentials of K (K is an integer not less than 1 and not more than N) readout wiring lines included in the N readout wiring lines to a potential different from input potentials of corresponding K integration circuits, and a controlling section for controlling an output operation of voltage values in the signal output section and a switching operation of potentials in the potential changing means, in which the controlling section switches potentials of the K readout wiring lines to the different potential for a predetermined period included in a period, after an elapse of a readout period where voltage values corresponding to amounts of charges generated in the M×N pixels are sequentially output from the signal output section, until a next readout period is started.

This solid-state imaging device can, for example, operate as follows. Charges accumulated, during an accumulation period, in the photodiodes of the respective pixels according to the intensities of light made incident onto the photodetecting section are output sequentially pixel by pixel in a readout period after the end of the accumulation period. That is, with regard to pixels contained in a certain row out of the M rows, charges accumulated in the photodiodes of the respective pixels are read out to the readout wiring lines of the columns via the transistors of the pixels. These charges are input to the integration circuits, and converted to voltage values to be sequentially output from the signal output section. As a result of such an operation being repeated sequentially for the first row through the M-th row, voltage values according to the amounts of charges accumulated in each of the M×N pixels are output pixel by pixel. Subsequently, the readout period is started again after an elapse of a next accumulation period.

In the above-mentioned solid-state imaging device, for a predetermined period included in a period, after an elapse of a readout period, until a next readout period is started (that is, within an accumulation period), the controlling section switches the potential of the readout wiring line to a different potential from the input potentials of the integration circuits by the potential changing means. The different potential is preferably set to, for example, a potential equivalent to (identical to or of a value close to) the electrode potential of the photodiodes of the respective pixels. Such a switching operation allows reducing a difference between the electrode potential of the photodiode and the potential of the readout wiring line to reduce a leak to the readout wiring line from the photodiode. Accordingly, the temporal variation in the offset between the photodiode electrode potential and readout wiring line potential is reduced. Therefore, by this solid-state imaging device, the amount of charge to be output from the photodiode can be stabilized irrespective of the length of the accumulation period, and the detection accuracy of incident light in the respective pixels can be improved. Also, in the above-mentioned solid-state imaging device, the potential changing means may be arranged to switch the potentials of the N readout wiring lines to a potential different from input potentials of the N integration circuits, where K=N.

Advantageous Effects of Invention

The solid-state imaging device by the present invention is capable of enhancing the detection accuracy of incident light in the respective pixels.

BRIEF DESCRIPTION OF DRAWINGS

FIG. 12 is a timing chart for explaining operation of a solid-state imaging device according to a third modification.

DESCRIPTION OF EMBODIMENTS

Hereinafter, embodiments of a solid-state imaging device according to the present invention will be described in detail with reference to the accompanying drawings. Also, the same components will be denoted with the same reference symbols in the description of the drawings, and overlapping description will be omitted.

(Embodiment)

Figure 1:
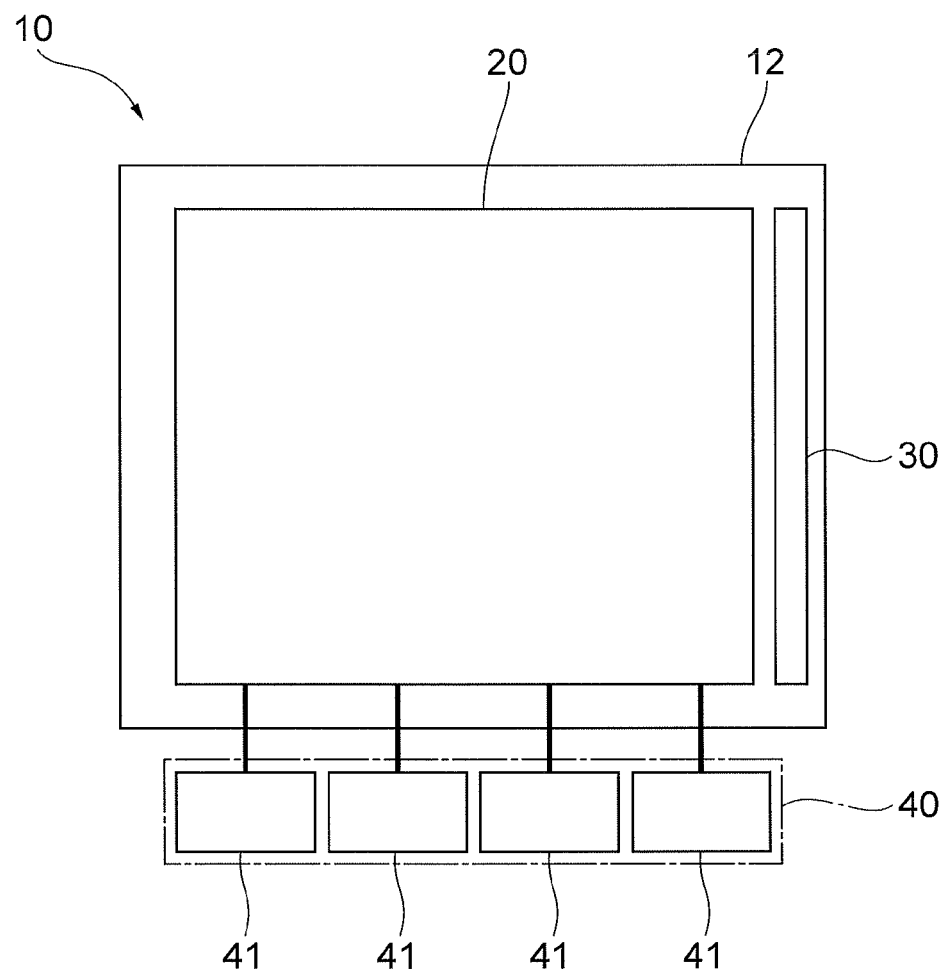
FIG. 1 is a plan view showing a solid-state imaging device.
Figure 2:
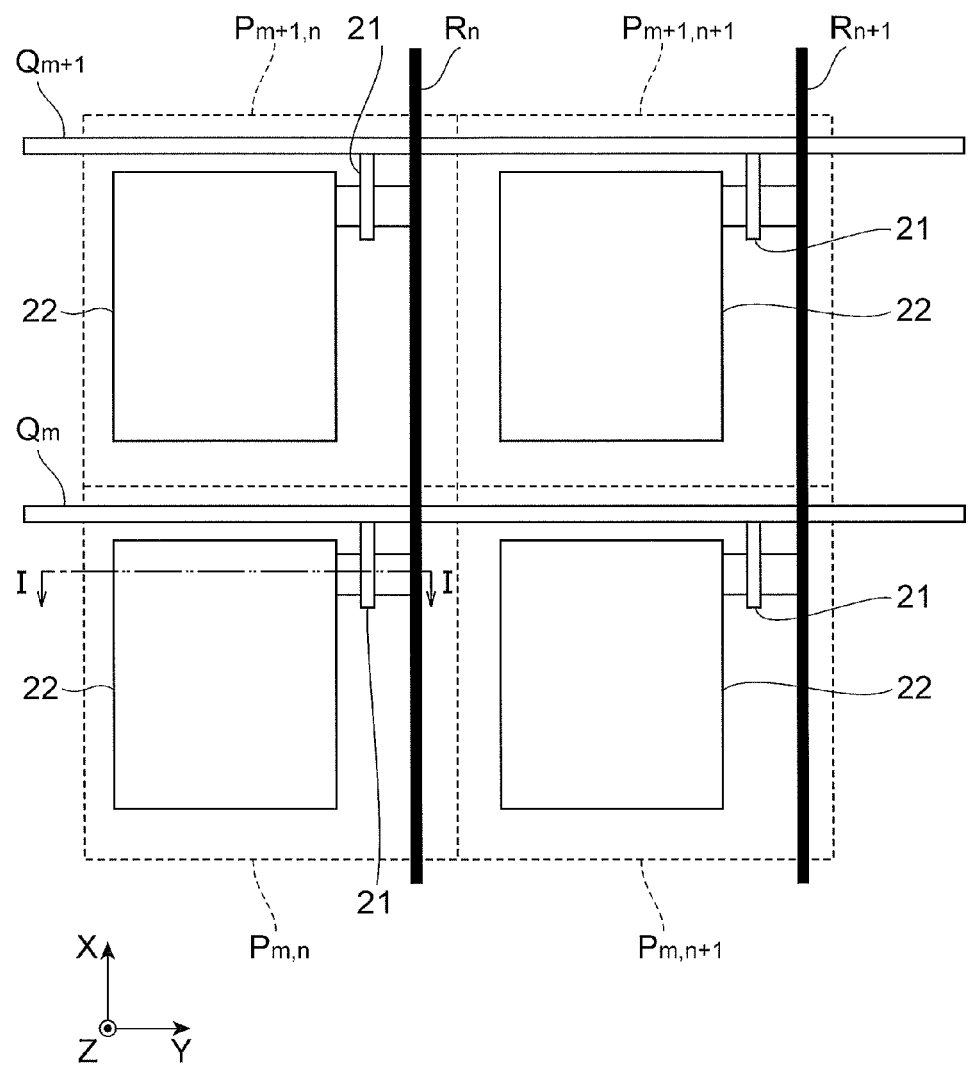
FIG. 2 is a partially enlarged plan view of the solid-state imaging device.
Figure 3:
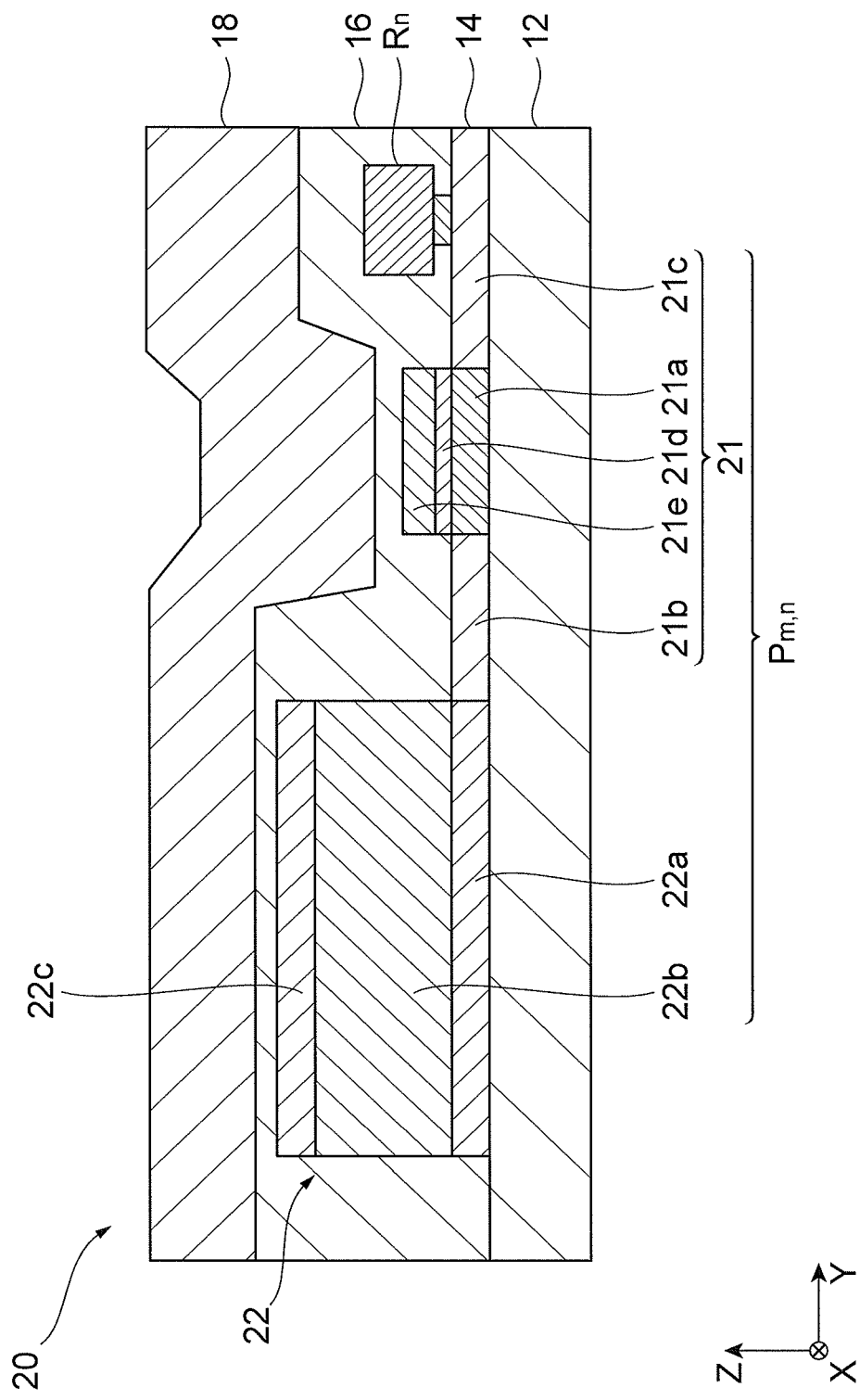
FIG. 3 is a side sectional view showing a section taken along a line I-I of FIG. 2.

The solid-state imaging device according to the present embodiment is used for, for example, a medical X-ray imaging system, and used particularly for a system for taking X-ray images of the jaw of a subject being tested by imaging modes such as panoramic radiography, cephalography, and CT in dentistry medical treatment. Therefore, the solid-state imaging device of the present embodiment includes thin-film transistors formed by polycrystalline silicon deposited on a large-area glass substrate and photodiodes formed by amorphous silicon deposited thereon, and has a remarkably wide photodetecting area as compared with that of a conventional solid-state imaging device prepared from a monocrystalline silicon wafer. FIG. 1 to FIG. 3 are views showing a configuration of the solid-state imaging device 10 of the present embodiment. FIG. 1 is a plan view showing the solid-state imaging device 10, and FIG. 2 is a partially enlarged plan view of the solid-state imaging device 10. Further, FIG. 3 is a side sectional view showing a section taken along a line I-I of FIG. 2. Also, in FIG. 1 to FIG. 3, an XYZ orthogonal coordinate system is also shown for easy understanding.

As shown in FIG. 1, the solid-state imaging device 10 includes a glass substrate 12 and a photodetecting section 20 and a vertical shift register section 30 fabricated on a principal surface of the glass substrate 12. The vertical shift register section 30 is disposed along a lateral side of the photodetecting section 20. Moreover, the solid-state imaging device 10 further includes a signal output section 40 disposed outside of the glass substrate 12. The signal output section 40 is composed of, for example, a plurality of C-MOS IC chips 41 electrically connected with the photodetecting section 20. The signal output section 40 includes N integration circuits provided respectively for the N columns of the photodetecting section 20, and these N integration circuits generate voltage values according to the amounts of charges output from the pixels of the first column through the N-th column. The signal output section 40 holds voltage values output from the respective integration circuits, and outputs the held voltage values successively.

Also, the photodetecting section 20 and the vertical shift register section 30 may be respectively provided on separate glass substrates 12. Further, the signal output section 40 may be provided on the glass substrate 12 with the photodetecting section 20 and the vertical shift register section 30.

The photodetecting section 20 is composed of M×N pixels two-dimensionally arrayed in M rows and N columns. The pixel $P_{m,n}$ shown in FIG. 2 is a pixel located on the m-th row and the n-th column. Here, m is an integer not less than 1 and not more than M, and n is an integer not less than 1 and not more than N. M and N are each an integer not less than 2. Also, in FIG. 2, the column direction is coincident with the X-axis direction, and the row direction is coincident with the Y-axis direction. Each of the plurality of pixels $P_{1,1}$ to $P_{M,N}$ included in the photodetecting section 20 includes a transistor 21 serving as a readout switch and a photodiode 22. One current terminal of the transistor 21 is connected to the photodiode 22. On the other hand, the other current terminal of the transistor 21 is connected to a corresponding readout wiring line (for example, in the case of the pixel $P_{m,n}$, an n-th column readout wiring line $R_n$). A control terminal of the transistor 21 is connected to a corresponding row selection wiring line (for example, in the case of the pixel $P_{m,n}$, an m-th row selection wiring line $Q_m$).

As shown in FIG. 3, over the entire surface on the glass substrate 12, a polycrystalline silicon film 14 is provided. The transistor 21, the photodiode 22, and the n-th column readout wiring line $R_n$ are formed on the surface of the polycrystalline silicon film 14. The transistor 21, the photodiode 22, and the n-th column readout wiring line $R_n$ are covered with an insulating layer 16, and on the insulating layer 16, a scintillator 18 is provided so as to cover the entire surface of the glass substrate 12. The scintillator 18 generates scintillation light in response to incident X-rays to convert an X-ray image into an optical image, and outputs the optical image to the photodetecting section 20. The n-th column readout wiring line $R_n$ is made of metal.

The photodiode 22 generates charge of an amount according to an incident light intensity, and accumulates the generated charge in a junction capacitance section. The photodiode 22 is a PIN photodiode including an n-type semiconductor layer 22a, an i-type semiconductor layer 22b, and a p-type semiconductor layer 22c. The n-type semiconductor layer 22a is a semiconductor layer made of n-type polycrystalline silicon. The i-type semiconductor layer 22b is a semiconductor layer made of i-type (undoped) amorphous silicon, and provided on the n-type semiconductor layer 22a. Thus, as a result of the i-type semiconductor layer 22b being formed of amorphous silicon, the i-type semiconductor layer 22b can be made thick, so that the photoelectric conversion efficiency of the photodiode 22 can be increased to improve the sensitivity of the solid-state imaging device 10. The p-type semiconductor layer 22c is a semiconductor layer made of p-type amorphous silicon, and provided on the i-type semiconductor layer 22b.

The transistor 21 is preferably constructed by a field effect transistor (FET), but may be constructed by a bipolar transistor. When the transistor 21 is an FET, the control terminal means a gate and the current terminal means a source or drain in the following description. The transistor 21 shown in FIG. 3 has an FET configuration, and includes a region made of polycrystalline silicon. For example, the transistor 21 includes a channel region 21a, a source region 21b, and a drain region 21c, each of which is made of polycrystalline silicon. The source region 21b is formed along one side surface of the channel region 21a. The drain region 21c is formed along the other side surface of the channel region 21a. Moreover, there is provided a gate electrode 21e on the channel region 21a, and there is interposed a gate insulating film 21d between the gate electrode 21e and the channel region 21a.

The polycrystalline silicon that forms the channel region 21a, the source region 21b, and the drain region 21c of the transistor 21 is more preferably low-temperature polycrystalline silicon (LTPS; Low Temperature Polycrystalline Silicon). The low-temperature polycrystalline silicon is polycrystalline silicon that is deposited at a relatively-low process temperature of 100 to 600° C. Under such a low temperature, because a glass substrate 12 such as, for example, alkali-free glass can be used as a support substrate, setting the forming material of the above-mentioned respective regions 21a, 21b, and 21c as low-temperature polycrystalline silicon allows using as a support substrate a glass substrate 12 having a large area as compared with a monocrystalline silicon wafer to fabricate a large-area photodetecting section 20 on the glass substrate 12.

In one example, as the material for the glass substrate 12, for example, sheet-like alkali-free glass (for substrate use) having a thickness such as 0.3 mm to 1.2 mm is used. The alkali-free glass contains little alkali, has a low coefficient of expansion and high heat resistance, and has stable characteristics. Moreover, the electron mobility in low-temperature polycrystalline silicon is 10 to 600 cm$^2$/Vs, which is greater than the electron mobility (0.3 to 1.0 cm$^2$/Vs) in amorphous silicon, and therefore, forming the regions 21a, 21b, and 21c of the transistor 21 by low-temperature polycrystalline silicon allows lowering the on-resistance of the transistor 21.

The pixel $P_{m,n}$ as shown in FIG. 3 is fabricated, for example, by the following process. First, an amorphous silicon film is formed on the glass substrate 12. As the film forming method, for example, plasma CVD is favorable.

Next, by sequentially irradiating the whole of the amorphous silicon film with laser beams (for example, excimer laser beams), the entire surface of the amorphous silicon film is made into polycrystalline silicon (excimer laser annealing). Thus, a polycrystalline silicon film 14 is formed. Then, after a SiO$_2$ film to serve as a gate insulating film 21d is formed on a partial region of the polycrystalline silicon film 14, a gate electrode 21e is formed thereon. Then, ions are implanted into respective regions to be the source region 21b and the drain region 21c. Subsequently, by carrying out patterning of the polycrystalline silicon film 14, exposure and etching are repeatedly carried out to form other electrodes and contact holes, etc. Moreover, after ions are implanted into a region to be the pixel $P_{m,n}$ in the polycrystalline silicon film 14 so as to become n-type, i-type and p-type amorphous silicon layers (i.e. an i-type semiconductor layer 22b and a p-type semiconductor layer 22c) are deposited thereon in order to form a PIN photodiode 22. Subsequently, a passivation film to serve as the insulating layer 16 is formed.

Figure 4:
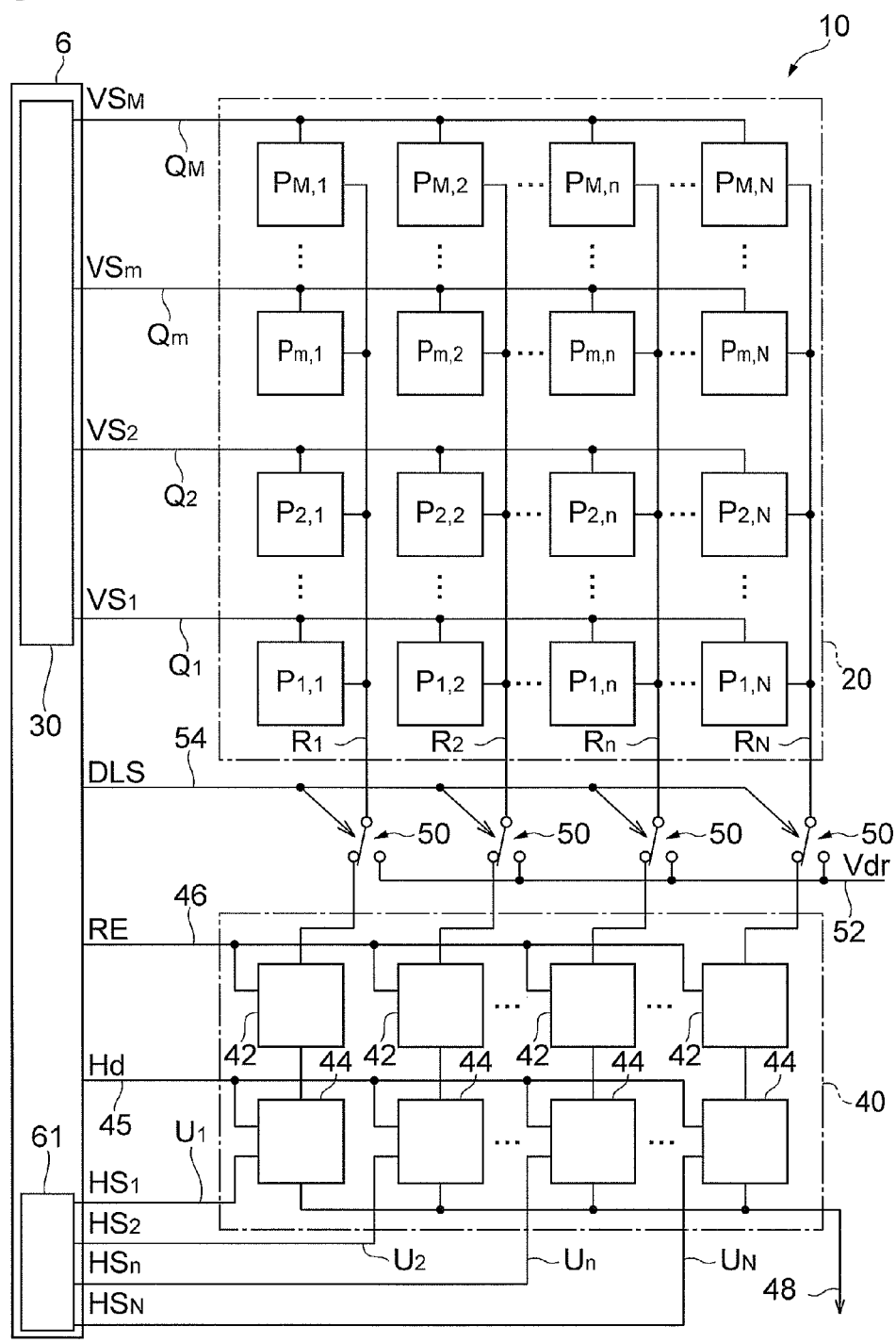
FIG. 4 is a diagram showing an internal configuration of the solid-state imaging device.

Next, a circuit configuration of the solid-state imaging device 10 will be described in detail. FIG. 4 is a diagram showing an internal configuration of the solid-state imaging device 10. As in the above, the photodetecting section 20 consists of M×N pixels $P_{1,1}$ to $P_{M,N}$ arrayed two-dimensionally in M rows and N columns. The N pixels $P_{m,1}$ to $P_{m,N}$ of the m-th row are connected to the vertical shift register section 30 via the m-th row selection wiring line $Q_m$. Also, in FIG. 4, the vertical shift register section 30 is included in a controlling section 6.

The signal output section 40 includes N integration circuits 42 and N holding circuits 44 provided for each column. The integration circuits 42 and the holding circuits 44 are connected in series with each other for each column. The N integration circuits 42 have a common configuration with each other. Moreover, the N holding circuits 44 have a common configuration with each other.

Moreover, in the present embodiment, N potential change switches 50 are provided for each column. The potential change switches 50 compose potential changing means in the present embodiment, and each potential change switch switches the potential of the readout wiring line corresponding to the potential change switch 50 out of the readout wiring lines $R_1$ to $R_N$ to a potential Vdr different from an input potential of the integration circuit 42. The potential Vdr is set to, for example, a constant potential equivalent to (identical to or of a value close to) the electrode potential of the photodiodes 22 of the respective pixels $P_{1,1}$ to $P_{M,N}$ in the accumulation period.

Each of the N potential change switches 50 is provided between the readout wiring line provided on the column concerned out of the readout wiring lines $R_1$ to $R_N$ and the integration circuit 42 of the column. The respective potential change switches 50 selectively connect the readout wiring lines $R_1$ to $R_N$ to either one of a wiring line 52 for supplying the potential Vdr and the integration circuits 42 of the columns concerned.

In one example, the n-th column readout wiring line $R_n$ is connected to an input terminal of the potential change switch 50 of the column concerned. The potential change switch 50 has two output terminals, and one output terminal is connected to the integration circuit 42 of the column concerned, and the other output terminal is connected to the wiring line 52. Control terminals included in the respective potential change switches 50 for controlling the connection state of the potential change switches 50 are connected to the controlling section 6 via a single potential change wiring line 54 provided in common for the N potential change switches 50. The controlling section 6 provides a potential change control signal DLS for instructing a switching operation of the potential change switches 50 to each of the N potential change switches 50 via the potential change wiring line 54.

Here, such N potential change switches 50 may be formed side by side with the photodetecting section 20 on the glass substrate 12, or may be formed on a monocrystalline silicon substrate prepared separately from the glass substrate 12. Forming N potential change switches 50 on a monocrystalline silicon substrate allows realizing a high-speed operation by channel regions, drain regions, and source regions made of monocrystalline silicon. Moreover, the degree of freedom in design and degree of integration can be increased without being bound by the process rules of polycrystalline silicon and amorphous silicon.

Each of the N integration circuits 42 has an input terminal connected to the potential change switch 50, and accumulates a charge input to the input terminal via the potential change switch 50 from each of the readout wiring lines $R_1$ to $R_N$, and outputs a voltage value according to the accumulated charge amount from an output terminal to each of the N holding circuits 44. Each of the N integration circuits 42 is connected to the controlling section 6 via a reset wiring line 46 provided in common for the N integration circuits 42. Each of the N holding circuits 44 has an input terminal connected to the output terminal of the integration circuit 42, holds a voltage value input to the input terminal, and outputs the held voltage value from an output terminal to a voltage output wiring line 48. Each of the N holding circuits 44 is connected to the controlling section 6 via a hold wiring line 45 provided in common for the N holding circuits 44. Moreover, each of the N holding circuits 44 is connected to a horizontal shift register section 61 of the controlling section 6 via each of the first column selection wiring line $U_1$ to the N-th column selection wiring line $U_N$.

The vertical shift register section 30 of the controlling section 6 provides an m-th row selection control signal $VS_m$ to each of the N pixels $P_{m,1}$ to $P_{m,N}$ of the m-th row via the m-th row selection wiring line $Q_m$. In the vertical shift register section 30, row selection control signals $VS_1$ to $VS_m$ sequentially take significant values. Moreover, the horizontal shift register section 61 of the controlling section 6 provides column selection control signals $HS_1$ to $HS_N$ to the respective N holding circuits 44 via the column selection wiring lines $U_1$ to $U_N$. The column selection control signals $HS_1$ to $HS_N$ also sequentially take significant values. Moreover, the controlling section 6 provides a reset control signal RE to each of the N integration circuits 42 via the reset wiring line 46, and provides a hold control signal Hd to each of the N holding circuits 44 via the hold wiring line 45.

Figure 5:
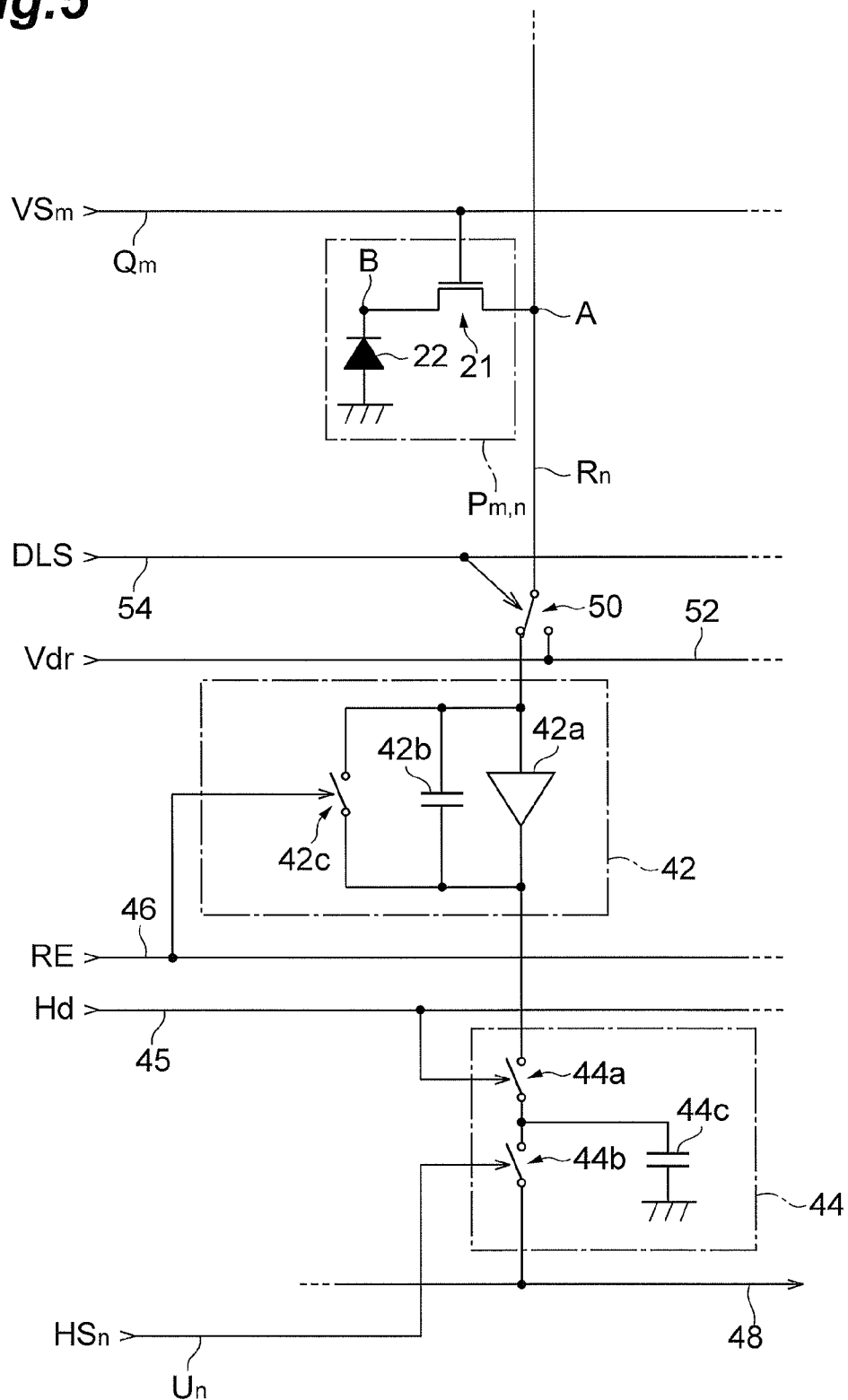
FIG. 5 is a diagram showing an example of a circuit configuration of each of the pixel, integration circuit, and holding circuit of the solid-state imaging device.

FIG. 5 is a diagram showing an example of a circuit configuration of each of the pixel $P_{m,n}$, integration circuit 42, and holding circuit 44 of the solid-state imaging device 10. Here, a circuit diagram of the pixel $P_{m,n}$ is shown as a representative of the M×N pixels $P_{1,1}$ to $P_{M,N}$.

As shown in FIG. 5, the anode terminal of the photodiode 22 of the pixel $P_{m,n}$ is grounded, and the cathode terminal is connected to the readout wiring line $R_n$ via the transistor 21. The transistor 21 of the pixel $P_{m,n}$ is provided with an m-th row selection control signal $VS_m$ via the m-th row selection wiring line $Q_m$ from the vertical shift register section 30. The m-th row selection control signal $VS_m$ instructs an opening and closing operation of the transistor 21 included in each of the N pixels $P_{m,1}$ to $P_{m,N}$ of the m-th row. For example, when the m-th row selection control signal $VS_m$ has a non-significant value (for example, low level), the transistor 21 reaches a non-connected state. At this time, a charge generated in the photodiode 22 is not output to the column readout wiring line $R_n$, but is accumulated in the junction capacitance section of the photodiode 22. On the other hand, when the m-th row selection control signal $VS_m$ has a significant value (for example, high level), the transistor 21 reaches a connected state. At this time, the charge that has been accumulated in the junction capacitance section of the photodiode 22 is output to the readout wiring line $R_n$ through the transistor 21. The readout wiring line $R_n$ is connected to the integration circuit 42 via the potential change switch 50, and this charge is sent to the integration circuit 42.

The integration circuit 42 includes an amplifier 42a, a capacitive element 42b, and a discharge switch 42c. The capacitive element 42b and the discharge switch 42c are connected in parallel with each other, and connected between an input terminal and an output terminal of the amplifier 42a. The input terminal of the amplifier 42a is connected with the readout wiring line $R_n$. The discharge switch 42c is provided with a reset control signal RE via the reset wiring line 46 from the controlling section 6.

The reset control signal RE instructs an opening and closing operation of the discharge switch 42c in each of the N integration circuits 42. For example, when the reset control signal RE has a non-significant value (for example, high level), the discharge switch 42c closes, the capacitive element 42b is discharged, and an output voltage value of the integration circuit 42 is initialized. On the other hand, when the reset control signal RE has a significant value (for example, low level), the discharge switch 42c opens, a charge input to the integration circuit 42 is accumulated in the capacitive element 42b, and a voltage value according to the accumulated charge amount is output from the integration circuit 42.

The holding circuit 44 includes an input switch 44a, an output switch 44b, and a capacitive element 44c. One end of the capacitive element 44c is grounded. The other end of the capacitive element 44c is connected to the output terminal of the integration circuit 42 via the input switch 44a, and connected with the voltage output wiring line 48 via the output switch 44b. The input switch 44a is provided with a hold control signal Hd via the hold wiring line 45 from the controlling section 6. The hold control signal Hd instructs an opening and closing operation of the input switch 44a in each of the N holding circuits 44. The output switch 44b of the holding circuit 44 is provided with an n-th column selection control signal $HS_n$ passed through the n-th column selection wiring line $U_n$ from the controlling section 6. The selection control signal $HS_n$ instructs an opening and closing operation of the output switch 44b of the holding circuit 44.

For example, when the hold control signal Hd switches from high level to low level, the input switch 44a switches from a closed state to an open state, and a voltage value being input to the holding circuit 44 at this time is held in the capacitive element 44c. Moreover, when the n-th column selection control signal $HS_n$ switches from low level to high level, the output switch 44b closes, and the voltage value held in the capacitive element 44c is output to the voltage output wiring line 48.

Next, description will be given of the operation of a solid-state imaging device not including a potential changing means (potential change switches 50) as a comparative example and a problem thereof, and then description will be given of the operation of the solid-state imaging device 10 according to the present embodiment and effects thereof.

Figure 6:
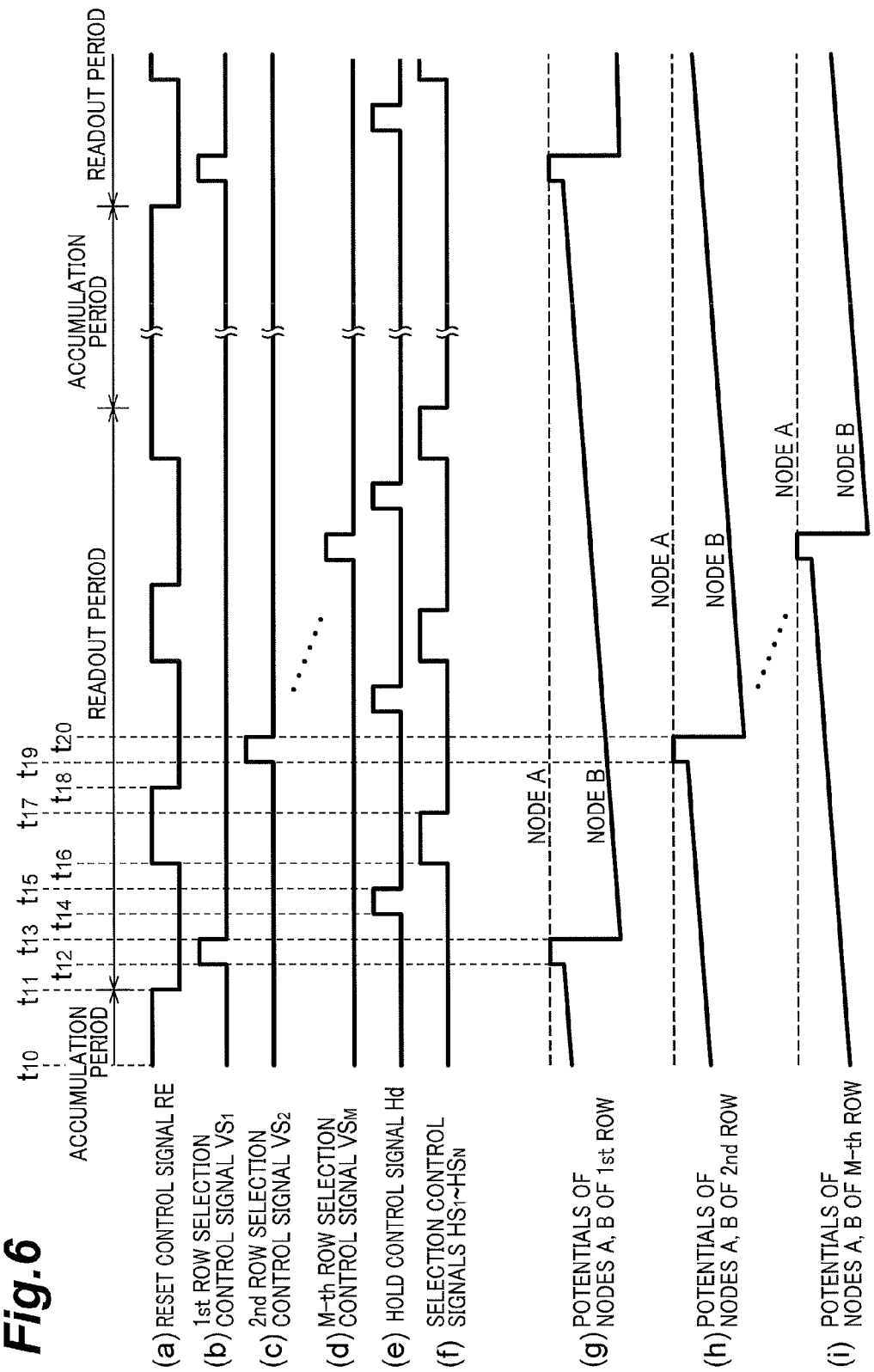
FIG. 6 is a timing chart for explaining operation of a solid-state imaging device according to a comparative example.

FIG. 6 is a timing chart for explaining operation of the solid-state imaging device according to the comparative example. FIG. 6 shows, in order from the top, (a) the reset control signal RE, (b) the first row selection control signal $VS_1$, (c) the second row selection control signal $VS_2$, (d) the M-th row selection control signal $VS_M$, (e) the hold control signal Hd, (f) the first column selection control signal $HS_1$ to the N-th column selection control signal $HS_N$, (g) the potentials of nodes A and nodes B (refer to FIG. 5) of the pixels $P_{1,1}$ to $P_{1,N}$ of the first row, (h) the potentials of nodes A and nodes B of the pixels $P_{2,1}$ to $P_{2,N}$ of the second row, and (i) the potentials of nodes A and nodes B of the pixels $P_{M,1}$ to $P_{M,N}$ of the M-th row. Also, the dashed lines in (g) to (i) of FIG. 6 show the potential of the node A in FIG. 5, and the solid lines show the node B (i.e. electrode potential of the photodiode 22).

In this comparative example, during a period from the time $t_{10}$ to the time $t_{11}$, the controlling section 6 makes the reset control signal RE high level. Accordingly, in each of the N integration circuits 42, the discharge switch 42c reaches a closed state, and the capacitive element 42b is discharged.

<Operation in Readout Period>

During a period from the time $t_{12}$ to the time $t_{13}$ after the time $t_{11}$, the controlling section 6 makes the first row selection control signal $VS_1$ high level. Accordingly, the transistors 21 reach a connected state in the pixels $P_{1,1}$ to $P_{1,N}$ of the first row, charges accumulated in the photodiodes 22 of the respective pixels $P_{1,1}$ to $P_{1,N}$ are output to the integration circuits 42 through the readout wiring lines $R_1$ to $R_N$, and accumulated in the capacitive elements 42b. From the integration circuits 42, voltage values of the magnitudes according to the amounts of charges accumulated in the capacitive elements 42b are output. Also, after the time $t_{13}$, the transistor 21 in each of the pixels $P_{1,1}$ to $P_{1,N}$ of the first row is brought into a non-connected state.

Then, during a period from the time $t_{14}$ to the time $t_{15}$ after the time $t_{13}$, the controlling section 6 makes the hold control signal Hd high level, and accordingly, the input switch 44a reaches a connected state in each of the N holding circuits 44, and a voltage value output from the integration circuit 42 is held by the capacitive element 44c.

Then, during a period from the time $t_{16}$ to the time $t_{17}$ after the time $t_{15}$, the controlling section 6 makes the first column selection control signal $HS_1$ to the N-th column selection control signal $HS_N$ sequentially high level. Accordingly, the output switches 44b of the N holding circuits 44 sequentially reach a closed state, and the voltage values that have been held in the capacitive elements 44c are successively output to the voltage output wiring line 48. Also, in the present embodiment, during a period from the time $t_{16}$ to the time $t_{18}$ after the time $t_{17}$, the controlling section 6 makes the reset control signal RE high level, and the capacitive element 42b of the integration circuit 42 is discharged.

Then, during a period from the time $t_{19}$ to the time $t_{20}$ after the time $t_{18}$, the controlling section 6 makes the second row selection control signal $VS_2$ high level. Accordingly, the transistors 21 reach a connected state in the pixels $P_{2,1}$ to $P_{2,N}$ of the second row, charges accumulated in the photodiodes 22 of the respective pixels $P_{2,1}$ to $P_{2,N}$ are output to the integration circuits 42 through the readout wiring lines $R_1$ to $R_N$, and accumulated in the capacitive elements 42b. Thereafter, by the same operation as in the case of the first row, voltage values of the magnitudes according to the amounts of charges accumulated in the capacitive elements 42b are successively output from the N holding circuits 44 to the voltage output wiring line 48. And, charges accumulated in the pixels of the third row through the M-th row are also converted into voltage values by the same operation as with the first row, and are successively output to the voltage output wiring line 48. Thus, readout of one frame of image data from the photodetecting section 20 is completed.

<Operation in Accumulation Period>

After the above-mentioned operation, the solid-state imaging device stops operation over a predetermined time, and makes sufficient amounts of light incident onto the photodiodes 22 of the respective pixels $P_{1,1}$ to $P_{M,N}$ to accumulate charges. The length of this accumulation period is arbitrarily set, but is, for example, not less than 0 seconds and not more than 10 seconds. After the accumulation period, the solid-state imaging device again repeats the readout operation described above. Also, because the above-described readout method is a so-called rolling shutter method, the exact charge accumulation time in the respective photodiodes 22 is a time starting from a moment where the transistors 21 of the pixels $P_{1,1}$ to $P_{M,N}$ have reached a non-connected state and until the transistors 21 of the pixels $P_{1,1}$ to $P_{M,N}$ again reach a connected state in the next readout period (i.e. a reciprocal of the frame rate).

Figure 7:
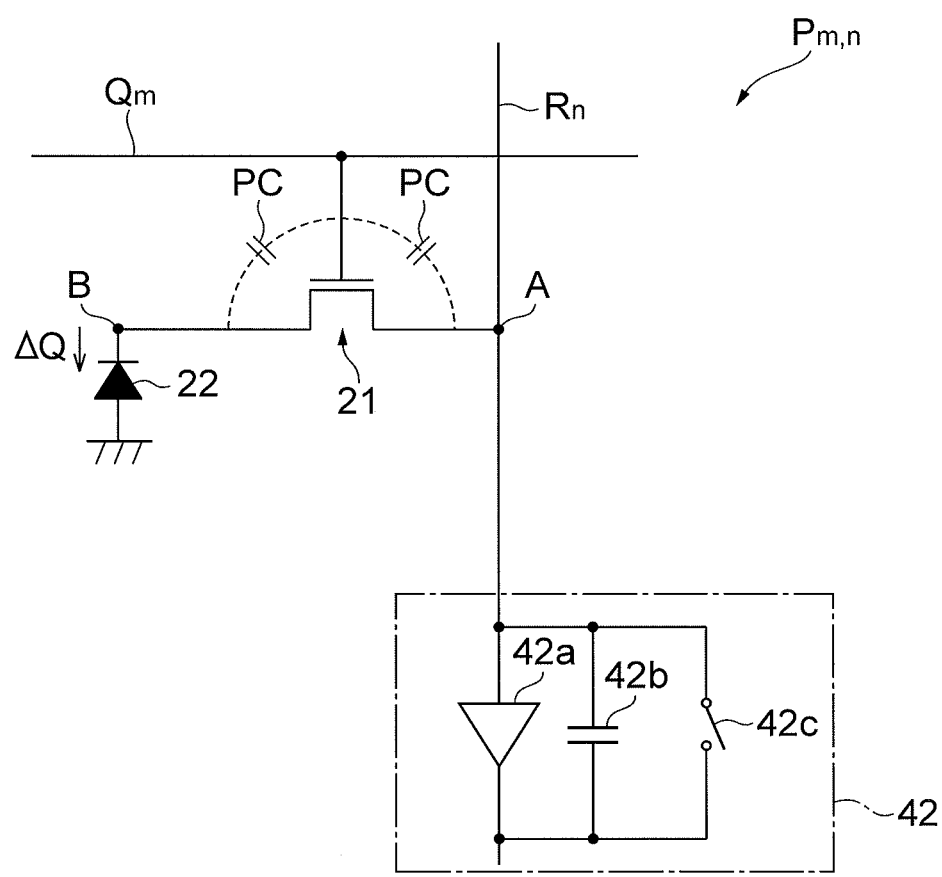
FIG. 7 is a diagram for explaining a problem in the comparative example, in which a transistor and a photodiode of one pixel, an integration circuit, a column readout wiring line, and a row selection wiring line are shown.

Here, a problem of the above-described solid-state imaging device will be described. FIG. 7 is a diagram for explaining the problem, in which a transistor 21 and a photodiode 22 of one pixel $P_{m,n}$, an integration circuit 42, an n-th column readout wiring line $R_n$, and an m-th row selection wiring line $Q_m$ are shown.

As shown in FIG. 7, the node A on the n-th column readout wiring line $R_n$ is connected to the input terminal of the amplifier 42a of the integration circuit 42, and the node A always has a constant potential (an input potential unique to the amplifier) (the dashed lines of (g) to (i) in FIG. 6). On the other hand, the node B on the electrode of the photodiode 22 is short-circuited with the node A when the transistor 21 reaches a connected state, and therefore has the same potential as that of the node A (the solid lines of (g) to (i) in FIG. 6, for example, time $t_{12}$ to time $t_{13}$). At this time, a charge that has been accumulated in the photodiode 22 is read out to the integration circuit 42 via the n-th column readout wiring line $R_n$, and the photodiode 22 is reset. Moreover, at this time, due to a parasitic capacitance PC that exists between the control terminal and each current terminal of the transistor 21, a charge is accumulated between the control terminal and each current terminal.

Subsequently, a voltage to be applied to the control terminal of the transistor 21 drops in order to bring the transistor 21 into a non-connected state. Accordingly, a charge $\Delta Q$ of an amount according to a drop (a difference between the on-voltage and off-voltage) in the voltage to be applied to the control terminal flows in the photodiode 22. Then, because a potential difference according to the charge amount of the charge $\Delta Q$ occurs between both ends of the photodiode 22, the potential of the node B drops by the potential difference. Also, a potential variation $\Delta Vb$ of the node B is expressed, by use of the capacitance Cpd of the photodiode 22, the difference $\Delta Vg$ between the on-voltage and off-voltage of the control terminal, and the parasitic capacitance PC of the transistor 21, as in the following formula (1).

$$\Delta Vb = \Delta Q/Cpd = \Delta Vg \cdot PC/Cpd \qquad (1)$$

Particularly, in a transistor including a region made of amorphous silicon or low-temperature polycrystalline silicon, because PC and $\Delta Vg$ are larger than those of a transistor made of monocrystalline silicon, the potential variation $\Delta Vb$ in the node B is remarkably large. Moreover, because a transistor including a region made of amorphous silicon or low-temperature polycrystalline silicon has an off-resistance smaller than that of a transistor made of monocrystalline silicon, the magnitude of a leak between the current terminals is considerable. Because there is a potential difference between the current terminals of the transistor due to the potential variation ΔVb of the node B described in the foregoing, as a result of a leak of the transistor 21, the potential of the node B approximates (rises) the potential of the node A with the elapse of time. Also, the solid lines of (g) to (i) in FIG. 6 show such changes in potential of the nodes B, and in which accumulation of charges due to incident light in the photodiodes 22 has not been taken into consideration. That is, the solid lines of (g) to (i) in FIG. 6 show offset components of the photodiodes 22.

Thus, the fact that the magnitude of parasitic capacitance and the off-resistance of the transistor 21 are limited causes a problem that offset components (the potentials of the nodes B) of the photodiodes 22 vary temporally. If the offset component of the photodiode 22 thus varies temporally, the amount of charge to be output from the photodiode 22 varies depending on whether the setting value of the accumulation period is for a long or short period, which therefore becomes a factor for degradation in detection accuracy of incident light in the respective pixels $P_{1,1}$ to $P_{M,N}$.

Figure 8:
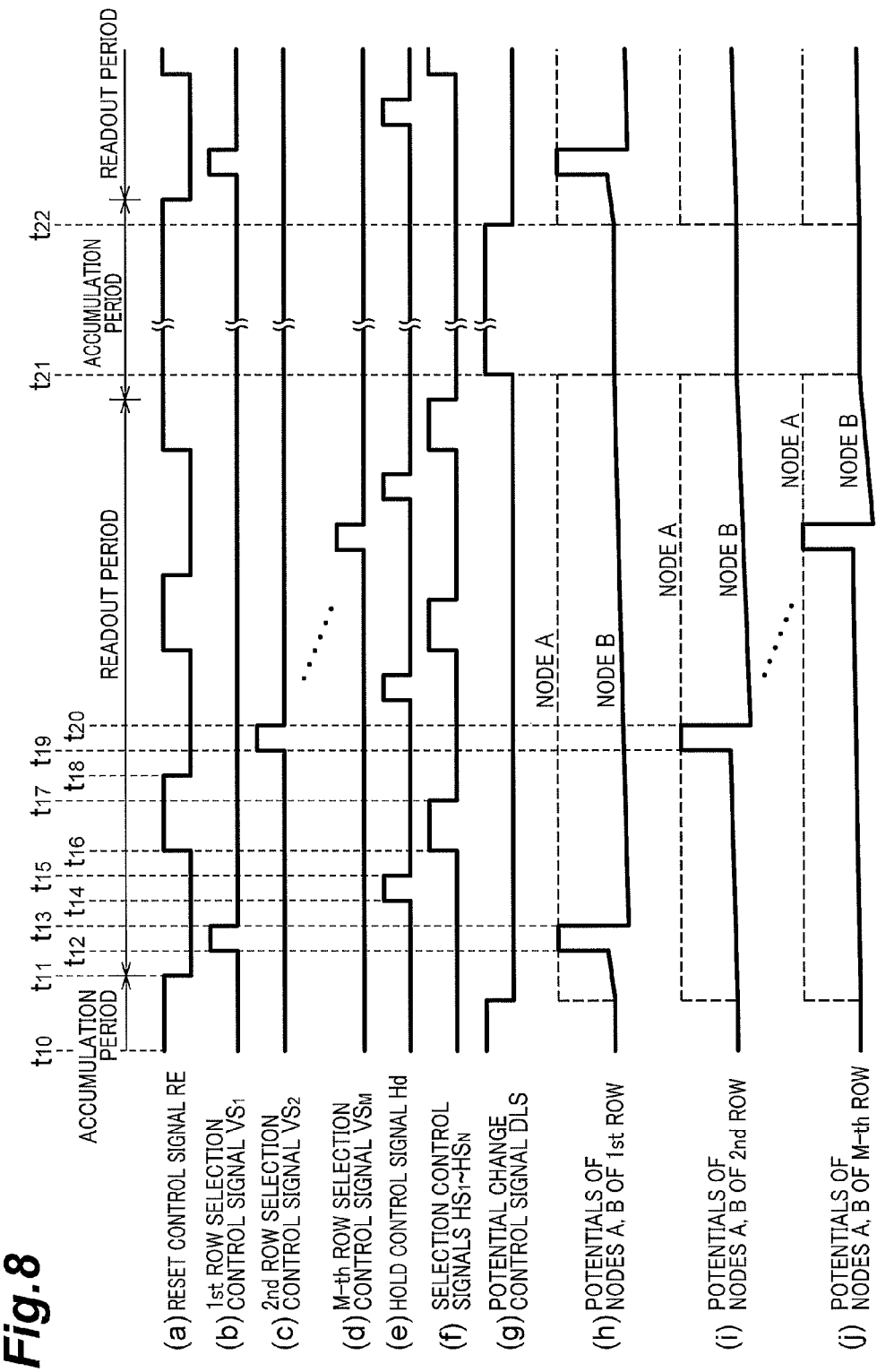
FIG. 8 is a timing chart for explaining operation of the solid-state imaging device.

In order to solve such a problem, the solid-state imaging device 10 of the present embodiment includes the potential changing means (potential change switches 50). FIG. 8 is a timing chart for explaining operation of the solid-state imaging device 10 according to the present embodiment, and shows, in order from the top, (a) the reset control signal RE, (b) the first row selection control signal $VS_1$, (c) the second row selection control signal $VS_2$, (d) the M-th row selection control signal $VS_M$, (e) the hold control signal Hd, (f) the first column selection control signal $HS_1$ to the N-th column selection control signal $HS_N$, (g) the potential change control signal DLS, (h) the potentials of nodes A and nodes B of the pixels $P_{1,1}$ to $P_{1,N}$ of the first row, (i) the potentials of nodes A and nodes B of the pixels $P_{2,1}$ to $P_{2,N}$ of the second row, and (j) the potentials of nodes A and nodes B of the pixels $P_{M,1}$ to $P_{M,N}$ of the M-th row.

The difference between the respective charts shown in FIG. 6 and FIG. 8 is whether a chart regarding the potential change control signal DLS exists and the waveforms of electrode potentials of the photodiodes 22. In the solid-state imaging device 10 of the present embodiment, for a period from the time $t_{21}$ to the time $t_{22}$ included in the accumulation period, the connection state of the potential change switches 50 is switched. Accordingly, the potential of the nodes A becomes equal to the potential Vdr. Because this potential Vdr has been set to a constant potential equivalent to the electrode potential of the photodiodes 22 of the respective pixels $P_{1,1}$ to $P_{M,N}$ in the accumulation period (that is, a potential where the above-mentioned potential variation ΔVb has been taken into consideration), a potential difference that occurs between the current terminals of the transistor 21 is made small during the period from the time $t_{21}$ to the time $t_{22}$. As a result, a leak between the current terminals of the transistor 21 is suppressed, and the temporal variation in the offset component of the photodiode 22 can be reduced. Therefore, by this solid-state imaging device 10, the amount of charge to be output from the photodiodes 22 can be stabilized irrespective of the length of the accumulation period, and the detection accuracy of incident light in the respective pixels $P_{1,1}$ to $P_{M,N}$ can be improved.

Such effects of the solid-state imaging device 10 of the present embodiment are remarkable when the accumulation period is sufficiently longer than the readout period. This is because, in FIG. 6, the longer the accumulation period, the larger variation in electrode potential of the photodiodes 22.

Moreover, in the present embodiment, the channel region 21a, the source region 21b, and the drain region 21c of the transistor 21 are made of polycrystalline silicon. In recent years, for solid-state imaging elements such as two-dimensional flat panel image sensors to be used, for example, for medical purposes (such as dental radiography), wider photodetecting surfaces have been demanded. However, if photodetecting sections are fabricated on monocrystalline silicon wafers as in prior solid-state imaging elements, the extent of photodetecting surfaces of the solid-state imaging elements is limited due to the size of the monocrystalline silicon wafers that are at most 12 inches in diameter. To cope therewith, forming a film of polycrystalline silicon on an insulating substrate such as a glass substrate, and forming photodiodes and other electronic components such as transistors on the surface of the polycrystalline silicon enables making the photodetecting surfaces remarkably wide as compared with those of conventional solid-state imaging elements formed with use of monocrystalline silicon wafers.

Moreover, when these regions 21a to 21c of the transistor 21 are made of polycrystalline silicon, as compared with a transistor made of monocrystalline silicon, the parasitic capacitance between the control terminal and current terminal is large. However, the solid-state imaging device 10 of the present embodiment can effectively suppress, by the above-described excellent effects, the influence of an increase in parasitic capacitance.

Further, in the present embodiment, the channel region 21a, the source region 21b, and the drain region 21c of the transistor 21 may be made of amorphous silicon, and may be made both of polycrystalline silicon and amorphous silicon. Also in this case, the effects of the solid-state imaging device 10 of the present embodiment described above can be favorably obtained.

However, when the frame rate is high, the transistor 21 made of amorphous silicon has a problem (a so-called memory effect) that a charge is transiently trapped when the transistor is brought into a non-connected state. This is because amorphous silicon is non-crystalline, and therefore results in a high density of levels to trap a charge in FET channels. On the other hand, because polycrystalline silicon (particularly, low-temperature polycrystalline silicon) has a low density of trapping levels, forming the transistor 21 by polycrystalline silicon allows suppressing the occurrence of such a memory effect.

Moreover, in the present embodiment, the potential changing means includes N potential change switches 50 provided between the N readout wiring lines $R_1$ to $R_N$ and the N integration circuits 42, and the N potential change switches 50 selectively connect each of the N readout wiring lines $R_1$ to $R_N$ to either one of a wiring line 52 for supplying the different potential Vdr and the N integration circuits 42. As a result of the potential changing means having such an arrangement, the potentials of the readout wiring lines $R_1$ to $R_N$ can be favorably switched to the potential Vdr different from the input potentials of the integration circuits 42.

(First Modification)

Figure 9:
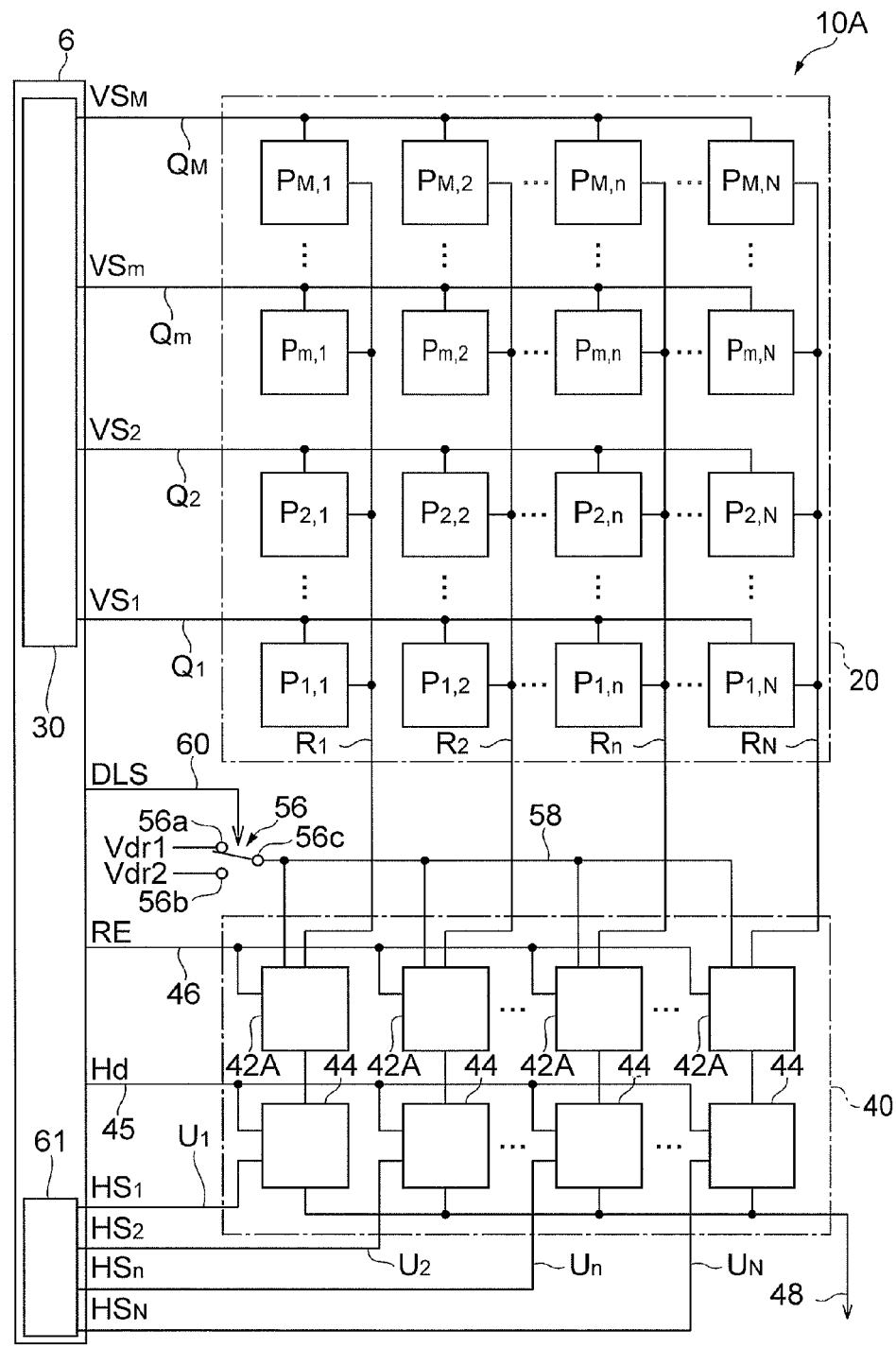
FIG. 9 is a diagram showing an internal configuration of a solid-state imaging device of a first modification.
Figure 10:
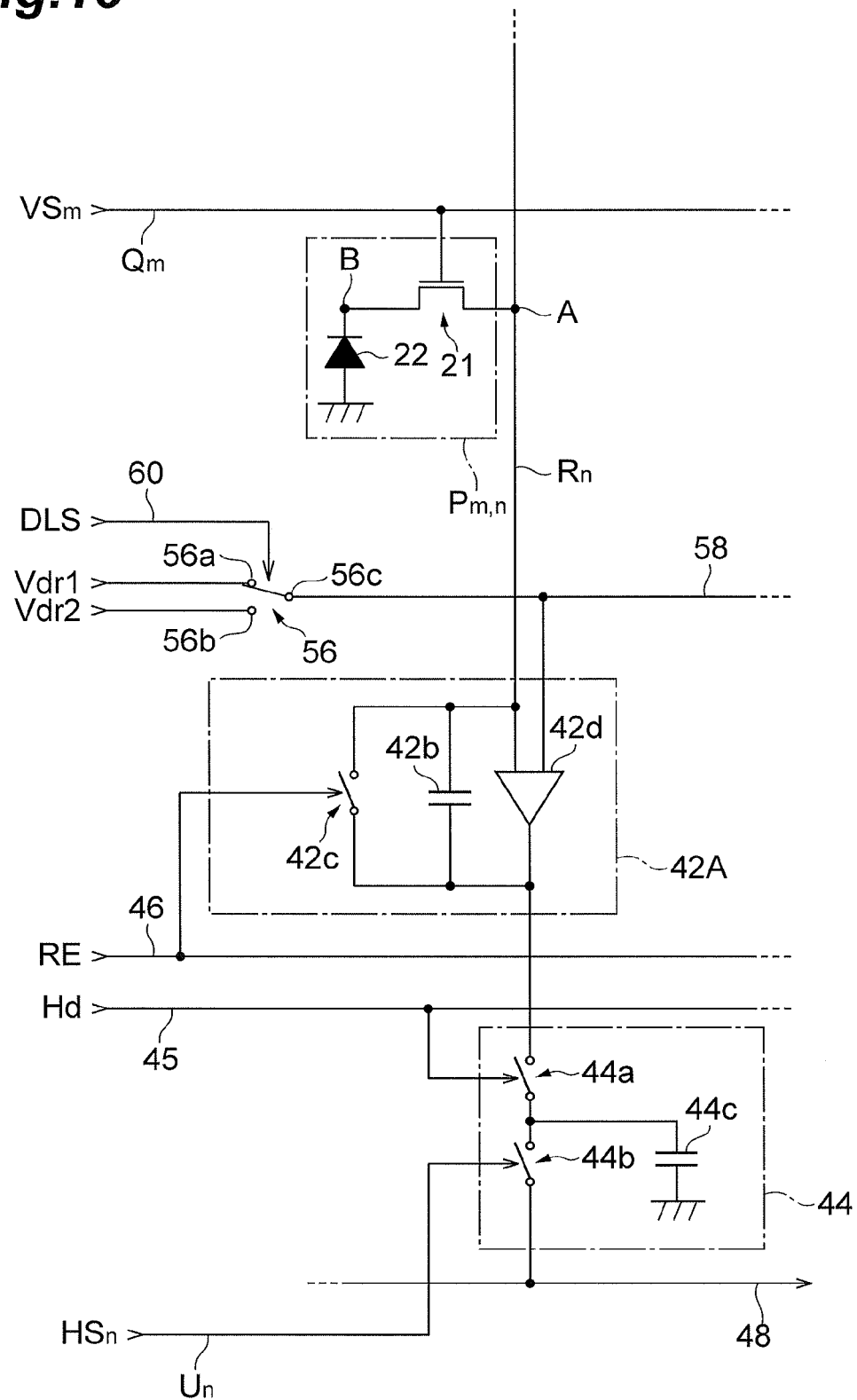
FIG. 10 shows a configuration of a pixel, an integration circuit, and a holding circuit and a peripheral circuit of those in the solid-state imaging device of the first modification.

FIG. 9 and FIG. 10 are diagrams showing a first modification of the solid-state imaging device 10 according to the above-mentioned embodiment. FIG. 9 is a diagram showing an internal configuration of a solid-state imaging device 10A of the present modification. FIG. 10 shows a configuration of a pixel $P_{m,n}$, an integration circuit 42A, and a holding circuit 44 and a peripheral circuit of those in this solid-state imaging device 10A.

The difference between the solid-state imaging device 10A according to the present modification and the above-mentioned embodiment is the configuration of the potential changing means and integration circuit. The solid-state imaging device 10A according to the present modification includes, as a potential changing means, a switch 56 and a wiring line 58 in place of the N potential change switches 50 shown in FIG. 4. The switch 56 has an input terminal 56*a* (a first input terminal), an input terminal 56*b* (a second input terminal), and an output terminal 56*c*, and selectively connects either of the input terminals 56*a* and 56*b* and the output terminal 56*c* to each other. The selection as to which of the input terminals 56*a* and 56*b* is connected to the output terminal 56*c* is performed by a potential change control signal DLS provided from the controlling section 6. Specifically, a control terminal included in the switch 56 for controlling the connection state of the switch 56 is connected to the controlling section 6 via a potential change wiring line 60 connected to the switch 56. The controlling section 6 provides a potential change control signal DLS for instructing a switching operation of the switch 56 to the switch 56 via the potential change wiring line 60.

Moreover, as shown in FIG. 10, the integration circuit 42A of the present modification includes a differential amplifier 42*d* in place of the amplifier 42*a* shown in FIG. 5. One of the two input terminals of the differential amplifier 42*d* is connected with each of the readout wiring lines $R_1$ to $R_N$ of the column concerned. The output terminal 56*c* of the switch 56 is connected via the wiring line 58 to the input terminal, out of the two input terminals of the differential amplifier 42*d*, different from the input terminal to which each of the readout wiring lines $R_1$ to $R_N$ is connected. To one input terminal 56*a* of the switch 56, a potential Vdr1 for resetting the photodiode 22 when reading out a charge of the photodiode 22 is applied. To the other input terminal 56*b* of the switch 56, a potential Vdr2 different from the potential Vdr1 is applied. The potential Vdr2 corresponds to the potential Vdr in the above-mentioned embodiment, and is set to, for example, a constant potential equivalent to (identical to or of a value close to) the electrode potential of the photodiodes 22 of the respective pixels $P_{1,1}$ to $P_{M,N}$ in the accumulation period.

Thus, the potential changing means is composed of the switch 56 and the wiring line 58 in the present modification, and by switching the potential (reference potential) to be input to the other input terminal of the differential amplifier 42*d*, the potential of each of the readout wiring lines $R_1$ to $R_N$ is switched to the potential Vdr2 different from the potential of one input terminal of the integration circuit 42A. The potential changing means may have such a configuration, and the solid-state imaging device 10A of the present modification can provide the same effects as those of the embodiment described above.

(Second Modification)

Figure 11:
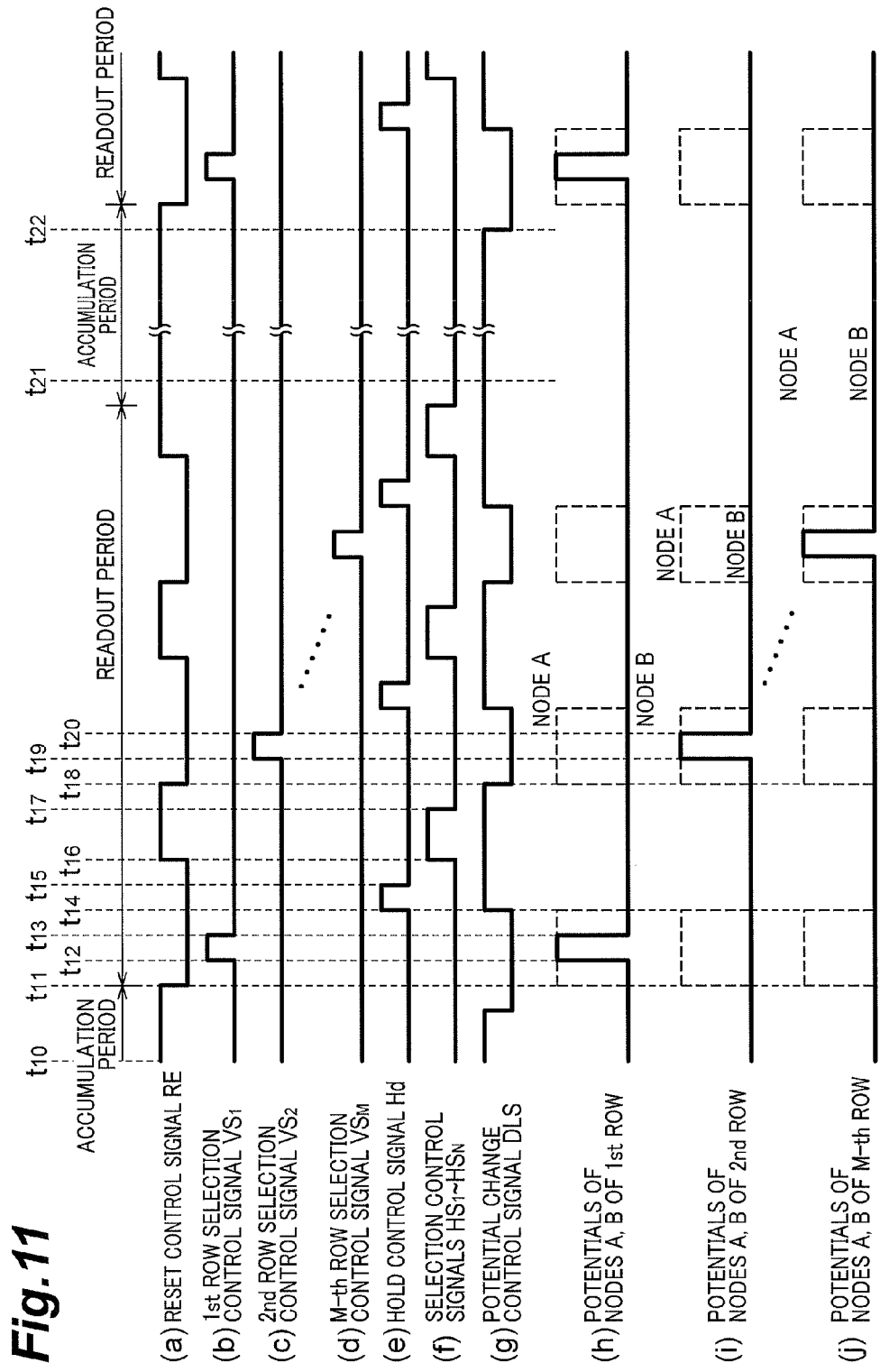
FIG. 11 is a timing chart for explaining operation of a solid-state imaging device according to a second modification.

FIG. 11 is a timing chart for explaining operation of a solid-state imaging device as a second modification of the solid-state imaging device 10 according to the above-mentioned embodiment. FIG. 11 shows, in order from the top, (a) the reset control signal RE, (b) the first row selection control signal $VS_1$, (c) the second row selection control signal $VS_2$, (d) the M-th row selection control signal $VS_M$, (e) the hold control signal Hd, (f) the first column selection control signal $HS_1$ to the N-th column selection control signal $HS_N$, (g) the potential change control signal DLS, (h) the potentials of nodes A and nodes B of the pixels $P_{1,1}$ to $P_{1,N}$ of the first row, (i) the potentials of nodes A and nodes B of the pixels $P_{2,1}$ to $P_{2,N}$ of the second row, and (j) the potentials of nodes A and nodes B of the pixels $P_{M,1}$ to $P_{M,N}$ of the M-th row.

The difference between the timing chart according to the above-mentioned embodiment shown in FIG. 8 and the timing chart according to the present modification shown in FIG. 11 is the timing at which the potential change control signal DLS reaches an ON-state and the waveforms of electrode potential of the photodiodes 22. In the present modification, control for making the potential change control signal DLS low level in periods where the row selection control signals $VS_1$ to $VS_M$ are high level and making the change control signal DLS high level in other periods is performed. In the solid-state imaging device of the present modification, in addition to the period from the time $t_{21}$ to the time $t_{22}$ included in the accumulation period, for a period from the time $t_{14}$ at which the hold control signal Hd becomes high level to the time $t_{18}$ at which the reset control signal RE becomes low level (that is, a period including a period from the time $t_{14}$ to the time $t_{15}$ during which the controlling section 6 makes the hold control signal Hd high level and a period from the time $t_{16}$ to the time $t_{17}$ where voltage values that have been held in the capacitive elements 44*c* are successively output to the voltage output wiring line 48 and not including a period during which the controlling section 6 makes any of the row selection control signals $VS_1$ to $VS_M$ high level), the connection state of the potential change switches 50 (or the switch 56 shown in FIG. 10) is switched. Accordingly, the potential of the nodes A becomes equal to the potential Vdr (or Vdr2). Accordingly, a leak between the current terminals of the transistor 21 is suppressed also in the period from the time $t_{14}$ to the time $t_{18}$, and the temporal variation in the offset component in the photodiode 22 can be further reduced. Therefore, by this modification, the detection accuracy of incident light in the respective pixels $P_{1,1}$ to $P_{M,N}$ can be further improved.

(Third Modification)

FIG. 12 is a timing chart for explaining operation of a solid-state imaging device as a third modification of the solid-state imaging device 10 according to the above-mentioned embodiment. FIG. 12 shows, in order from the top, (a) the reset control signal RE, (b) the first row selection control signal $VS_1$, (c) the second row selection control signal $VS_2$, (d) the M-th row selection control signal $VS_M$, (e) the hold control signal Hd, (f) the first column selection control signal $HS_1$ to the N-th column selection control signal $HS_N$, (g) the potential change control signal DLS, (h) the potentials of nodes A and nodes B of the pixels $P_{1,1}$ to $P_{1,N}$ of the first row, (i) the potentials of nodes A and nodes B of the pixels $P_{2,1}$ to $P_{2,N}$ of the second row, and (j) the potentials of nodes A and nodes B of the pixels $P_{M,1}$ to $P_{M,N}$ of the M-th row.

The difference between the timing chart according to the above-mentioned embodiment shown in FIG. 8 and the timing chart according to the present modification shown in FIG. 12 is the timing at which the row selection control signals $VS_1$ to $VS_M$ become high level. In the solid-state imaging device of the present modification, in addition to the time $t_{12}$ to the time $t_{13}$, the time $t_{19}$ to the time $t_{20}$, etc., during which the row selection control signals $VS_1$ to $VS_M$ become high level in the above-mentioned embodiment, periods during which the row selection control signals $VS_1$ to $VS_M$ become high level are provided also within the period (the time $t_{16}$ to the time $t_{18}$ etc.) where the reset control signal RE is high level.

Thus, as a result of the row selection control signals $VS_1$ to $VS_M$ becoming high level in parallel with a discharging operation of the capacitive element 42*b* of the integration circuit 42, the following effects can be obtained. That is, charges that have remained without being output from the photodiodes 22 in the period from the time $t_{12}$ to the time $t_{13}$ can be output to the integration circuits 42 through the transistors 21 and the readout wiring lines $R_1$ to $R_N$, and discharged together with charges that have been accumulated in the capacitive elements 42*b*. Therefore, the influence of a so-called delay effect that charges accumulated in the photodiodes 22 are superimposed on a next frame of data can be effectively reduced.

Also, the operation of the row selection control signals $VS_1$ to $VS_M$ as in the present modification can also be applied to the above-mentioned second modification. However, in that case, it is preferable to perform a switching operation of the potential change switches 50 in a period excluding periods where the row selection control signals $VS_1$ to $VS_M$ are high level (that is, periods where the transistors 21 are in a connected state).

The solid-state imaging device by the present invention is not limited to the embodiments and modifications described above, and various other modifications can be made. For example, in the above-mentioned embodiment and modifications, description has been given of an example in which the present invention is applied to a solid-state imaging device formed by film-forming of polycrystalline silicon and amorphous silicon on a glass substrate, but the present invention is not limited to such a configuration, and can also be applied to, for example, a solid-state imaging element that is fabricated on a monocrystalline silicon substrate.

Moreover, an FET has been exemplified as the transistor 21 included in each pixel in the above-mentioned embodiment and modifications, but the transistor 21 may be a bipolar transistor. In that case, the control terminal means a base and the current terminal means a collector or an emitter. Moreover, in the above-mentioned embodiment, there is an arrangement, for the photodetecting section having M×N pixels, that the potential changing means switches the potentials of the N readout wiring lines to a potential different from input potentials of the N integration circuits, however, without limitation to such an arrangement, generally, it suffices that the potential changing means is arranged to switch the potentials of K readout wiring lines included in the N readout wiring lines to a potential different from input potentials of corresponding K integration circuits, where K is an integer not less than 1 and not more than N.

The solid-state imaging device of the above-described embodiment includes a light receiving section consisting of M×N (M is an integer not less than 2, N is an integer not less than 2) pixels each including a photodiode and a transistor connected at one end to the photodiode that are arrayed two-dimensionally in M rows and N columns, N readout wiring lines arranged for each column, and connected to the-other-side ends of the transistors included in the pixels of corresponding columns, a signal output section including N integration circuits for generating voltage values according to amounts of charges input through the respective N readout wiring lines, and for sequentially outputting voltage values output from the N integration circuits, a potential changing means for switching potentials of K (K is an integer not less than 1 and not more than N) readout wiring lines included in the N readout wiring lines to a potential different from input potentials of corresponding K integration circuits, and a controlling section for controlling an output operation of voltage values in the signal output section and a switching operation of potentials in the potential changing means, and is arranged such that the controlling section switches potentials of the K readout wiring lines to the different potential for a predetermined period included in a period, after an elapse of a readout period where voltage values corresponding to amounts of charges generated in the M×N pixels are sequentially output from the signal output section, until a next readout period is started.

Moreover, the solid-state imaging device may be arranged such that the transistor includes a region made of at least one of polycrystalline silicon and amorphous silicon. When the transistor includes a region made of these materials, the parasitic capacitance is large as compared with that of a transistor made of monocrystalline silicon. The above-mentioned solid-state imaging device is particularly favorable in such a case.

Moreover, the solid-state imaging device may be arranged such that the potential changing means includes K switches provided between the K readout wiring lines and the K integration circuits, and the K switches selectively connect each of the K readout wiring lines to either one of a wiring line for supplying the different potential and each of the K integration circuits. As a result of the potential changing means having such an arrangement, the potentials of the readout wiring lines can be favorably switched to the potential different from the input potentials of the integration circuits. In this case, the K switches may include a region made of monocrystalline silicon.

Moreover, the solid-state imaging device may be arranged such that each of the K integration circuits includes a differential amplifier and a capacitive element connected between one input terminal and an output terminal of the differential amplifier, the potential changing means includes a switch having first and second input terminals and an output terminal and for selectively connecting either of the first and second input terminals and the output terminal, the output terminal is connected to the other input terminal of the differential amplifier, the first input terminal is applied with a potential corresponding to the input potential, and the second input terminal is applied with the different potential. As a result of the potential changing means having such an arrangement, the potentials of the readout wiring lines can be favorably switched to the potential different from the input potentials of the integration circuits.

Also, in the above-mentioned solid-state imaging device, the potential changing means may be arranged to switch the potentials of the N readout wiring lines to a potential different from input potentials of the N integration circuits, where K=N. That is, a solid-state imaging device may include a photodetecting section having M×N (M is an integer not less than 2, N is an integer not less than 2) pixels each including a photodiode and a transistor connected at one end to the photodiode that are arrayed two-dimensionally in M rows and N columns, N readout wiring lines arranged for each column, and connected to the-other-side ends of the transistors included in the pixels of corresponding columns, a signal output section including N integration circuits for generating voltage values according to amounts of charges input through the respective N readout wiring lines, and for sequentially outputting voltage values output from the N integration circuits, a potential changing means for switching potentials of the N readout wiring lines to a potential different from input potentials of the N integration circuits, and a controlling section for controlling an output operation of voltage values in the signal output section and a switching operation of potentials in the potential changing means, and may be arranged such that the controlling section switches potentials of the N readout wiring lines to the different potential for a predetermined period included in a period, after an elapse of a readout period where voltage values corresponding to amounts of charges generated in the M×N pixels are sequentially output from the signal output section, until a next readout period is started.

In this case, the solid-state imaging device may be arranged such that the potential changing means includes N switches provided between the N readout wiring lines and the N integration circuits, and the N switches selectively connect each of the N readout wiring lines to either one of a wiring line for supplying the different potential and each of the N integration circuits. As a result of the potential changing means having such an arrangement, the potentials of the readout wiring lines can be favorably switched to the potential different from the input potentials of the integration circuits. In this case, the N switches may include a region made of monocrystalline silicon.

Moreover, the solid-state imaging device may be arranged such that each of the N integration circuits includes a differential amplifier and a capacitive element connected between one input terminal and an output terminal of the differential amplifier, the potential changing means includes a switch having first and second input terminals and an output terminal and for selectively connecting either of the first and second input terminals and the output terminal, the output terminal is connected to the other input terminal of the differential amplifier, the first input terminal is applied with a potential corresponding to the input potential, and the second input terminal is applied with the different potential. As a result of the potential changing means having such an arrangement, the potentials of the readout wiring lines can be favorably switched to the potential different from the input potentials of the integration circuits.

INDUSTRIAL APPLICABILITY

The present invention can be applied as a solid-state imaging device capable of enhancing the detection accuracy of incident light in the respective pixels.

REFERENCE SIGNS LIST

6—controlling section, 10, 10A—solid-state imaging device, 12—glass substrate, 14—polycrystalline silicon film, 16—insulating layer, 18—scintillator, 20—photodetecting section, 21—transistor, 22—photodiode, 30—vertical shift register section, 40—signal output section, 41—chip, 42—integration circuit, 42a—amplifier, 42b—capacitive element, 42c—discharge switch, 42d—differential amplifier, 44—holding circuit, 44a—input switch, 44b—output switch, 44c—capacitive element, 50—potential change switch, 56—switch, 61—horizontal shift register section, A, B—node, DLS—potential change control signal, Hd—hold control signal, $HS_1$ to $HS_N$—column selection control signal, $P_{1,1}$ to $P_{M,N}$—pixel, $Q_1$ to $Q_M$—row selection wiring line, $R_1$ to $R_N$—readout wiring line, RE—reset control signal, $U_1$ to $U_N$—column selection wiring line, $VS_1$ to $VS_M$—row selection control signal.

The invention claimed is:

1. A solid-state imaging device comprising:
    a photodetecting section having M×N (M is an integer not less than 2, N is an integer not less than 2) pixels each including a photodiode and a transistor connected at one end to the photodiode that are arrayed two-dimensionally in M rows and N columns;
    N readout wiring lines arranged for each column, and connected to the-other-side ends of the transistors included in the pixels of corresponding columns;
    a signal output section including N integration circuits for generating voltage values according to amounts of charges input through the respective N readout wiring lines, and for sequentially outputting voltage values output from the N integration circuits;
    potential changing means for switching potentials of K (K is an integer not less than 1 and not more than N) readout wiring lines included in the N readout wiring lines to a potential different from input potentials of corresponding K integration circuits; and
    a controlling section for controlling an output operation of voltage values in the signal output section and a switching operation of potentials in the potential changing means, wherein
    the controlling section switches potentials of the K readout wiring lines to the different potential for a predetermined period included in a period, after an elapse of a readout period where voltage values corresponding to amounts of charges generated in the M×N pixels are sequentially output from the signal output section, until a next readout period is started.

2. The solid-state imaging device according to claim 1, wherein the transistor includes a region made of at least one of polycrystalline silicon and amorphous silicon.

3. The solid-state imaging device according to claim 1, wherein the potential changing means includes K switches provided between the K readout wiring lines and the K integration circuits, and the K switches selectively connect each of the K readout wiring lines to either one of a wiring line for supplying the different potential and each of the K integration circuits.

4. The solid-state imaging device according to claim 3, wherein the K switches include a region made of monocrystalline silicon.

5. The solid-state imaging device according to claim 1, wherein each of the K integration circuits includes a differential amplifier and a capacitive element connected between one input terminal and an output terminal of the differential amplifier,
    the potential changing means includes a switch having first and second input terminals and an output terminal and for selectively connecting either of the first and second input terminals and the output terminal,
    the output terminal is connected to the other input terminal of the differential amplifier,
    the first input terminal is applied with a potential corresponding to the input potential, and
    the second input terminal is applied with the different potential.

* * * * *